(12) United States Patent
Cho

(10) Patent No.: US 12,369,419 B2
(45) Date of Patent: Jul. 22, 2025

(54) IMAGE SENSING DEVICE

(71) Applicant: SK hynix Inc., Icheon-si (KR)

(72) Inventor: Sung Wook Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 439 days.

(21) Appl. No.: 17/859,280

(22) Filed: Jul. 7, 2022

(65) Prior Publication Data

US 2023/0042186 A1   Feb. 9, 2023

(30) Foreign Application Priority Data

Aug. 4, 2021   (KR) .................. 10-2021-0102761

(51) Int. Cl.
*H10F 39/00* (2025.01)
*H10F 39/18* (2025.01)

(52) U.S. Cl.
CPC .......... *H10F 39/807* (2025.01); *H10F 39/18* (2025.01); *H10F 39/182* (2025.01); *H10F 39/802* (2025.01); *H10F 39/8053* (2025.01); *H10F 39/8063* (2025.01)

(58) Field of Classification Search
CPC .......... H01L 27/1463; H01L 27/14621; H01L 27/14627; H01L 27/14645; H01L 27/14603; H01L 27/14643; H10F 39/807; H10F 39/18; H10F 39/182; H10F 39/802; H10F 39/8063; H10F 39/8053; H10F 39/8057; H10F 39/806
See application file for complete search history.

(56) References Cited

U.S. PATENT DOCUMENTS

| | | | | |
|---|---|---|---|---|
| 2014/0367817 A1* | 12/2014 | Furuta | ............... | H01L 27/14629 257/432 |
| 2017/0170216 A1* | 6/2017 | Lee | ..................... | H01L 27/1463 |
| 2017/0345853 A1* | 11/2017 | Kato | ..................... | H04N 23/67 |
| 2020/0295073 A1* | 9/2020 | Iwase | ..................... | H04N 25/50 |
| 2021/0066361 A1* | 3/2021 | Yang | ................. | H01L 27/14621 |
| 2021/0118929 A1* | 4/2021 | Yang | ................. | H01L 27/14623 |

FOREIGN PATENT DOCUMENTS

| | | |
|---|---|---|
| CN | 103229498 A | 7/2013 |
| CN | 112447781 A | 3/2021 |
| CN | 113206109 A | 8/2021 |
| KR | 20170071184 A | 6/2017 |
| KR | 20200141345 A | 12/2020 |

\* cited by examiner

*Primary Examiner* — Georgia Y Epps
*Assistant Examiner* — Erin G Garber
(74) *Attorney, Agent, or Firm* — Perkins Coie LLP

(57) ABSTRACT

An image sensing device includes a pixel array configured to include a plurality of pixel groups arranged in a matrix structure. Each of the pixel groups includes an optical filter configured to selectively pass incident light, a plurality of photoelectric conversion regions disposed below the optical filter and arranged in a matrix structure, a first isolation structure disposed between the photoelectric conversion regions and other pixel groups, a plurality of second isolation structures disposed between two adjacent photoelectric conversion regions from among the photoelectric conversion regions, and a third isolation structure disposed between the second isolation structures, and configured to interconnect the second isolation structures. The third isolation structure includes a cavity region formed adjacent to contact any one of the photoelectric conversion regions.

18 Claims, 6 Drawing Sheets

IMAGE SENSING DEVICE

CROSS-REFERENCE TO RELATED APPLICATION

This patent document claims the priority and benefits of Korean patent application No. 10-2021-0102761, filed on Aug. 4, 2021, the disclosure of which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device capable of improving imbalance between pixel signals.

In accordance with an embodiment of the disclosed technology, an image sensing device may include a pixel array configured to include a plurality of pixel groups arranged in rows and columns and to detect incident light, wherein each of the pixel groups includes an optical filter configured to selectively transmit the incident light, a plurality of photoelectric conversion regions disposed below the optical filter to convert the incident light into electrical signals, respectively, a first isolation structure disposed along an edge of each corresponding pixel group, a plurality of second isolation structures disposed between two adjacent photoelectric conversion regions of each corresponding pixel group and a third isolation structure disposed between the second isolation structures and configured to interconnect the second isolation structures, wherein the third isolation structure includes a cavity region formed adjacent to one of the photoelectric conversion regions of each corresponding pixel group.

In some implementations, each of the pixel groups further includes a microlens by which the incident light converges and the cavity region is disposed to be adjacent to a photoelectric conversion region located in a direction along which the incident light is incident upon the microlens.

In some implementations, each of the pixel groups further includes a microlens by which the incident light converges and the cavity region is disposed to be adjacent to a photoelectric conversion region located in a direction along which the incident light is emitted from the microlens.

In some implementations, the optical filter of a first pixel group includes at least one of a first optical filter configured to pass red light, a second optical filter configured to pass green light and a third optical filter configured to pass blue light.

In some implementations, the cavity region has a size that is determined based on wavelengths of light passing through the optical filter.

In some implementations, the cavity region disposed below the first optical filter has a larger size than that of another cavity region disposed below the third optical filter.

In some implementations, the cavity region has a size according to positions of the pixel group disposed over the pixel array.

In some implementations, the size of the cavity region is smaller as the corresponding pixel group is located closer to a center point of the pixel array.

In some implementations, each of the second isolation structures is disposed at a center of the two adjacent photoelectric conversion regions of the corresponding pixel group.

In some implementations, the third isolation structure is disposed at a center of the pixel group.

In some implementations, a first length corresponding to a length of the third isolation structure overlapping with a first diagonal line that passes through both a center of the pixel group and one vertex of the pixel group is different from a second length corresponding to a length of the third isolation structure overlapping with a second diagonal line that passes through both a center of the pixel group and another vertex of the pixel group.

In some implementations, the photoelectric conversion regions included in each of the pixel groups are arranged in a (2×2) matrix structure having two rows and two columns.

In some implementations, the photoelectric conversion regions included in each of the pixel groups are arranged in a (3×3) matrix structure having three rows and three columns.

In accordance with another embodiment of the disclosed technology, an image sensing device may include a pixel array configured to include a plurality of pixel groups, wherein the pixel groups includes a first pixel group that includes an optical filter configured to selectively pass incident light having a predetermined wavelength band, a plurality of photoelectric conversion regions disposed below the optical filter and arranged in rows and columns, a first isolation structure configured to isolate the plurality of the photoelectric conversion regions from other pixel groups, a plurality of second isolation structures disposed between two of the plurality of the photoelectric conversion regions and a third isolation structure interconnecting the second isolation structures, wherein any one of the plurality of the photoelectric conversion regions is adjacent to a cavity region extending from a center of the third isolation structure in a diagonal direction of the pixel array.

In some implementations, the first pixel group further includes a microlens, and wherein the cavity region extends parallel to a proceeding direction of the incident light.

In some implementations, each of the plurality of the photoelectric conversion regions has a same size.

In some implementations, the cavity region has a size depending on a location of the first pixel group such that the size becomes larger as the first pixel group is located farther from the center of the pixel array.

In some implementations, the plurality of the photoelectric conversion regions are arranged in a (2×2) matrix structure having two rows and two columns.

In some implementations, the plurality of the photoelectric conversion regions are arranged in a (3×3) matrix structure having three rows and three columns.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device capable of improving imbalance between pixel signals. Some implementations of the disclosed technology relate to an image sensing device which can improve imbalance between pixel signals output from the respective unit pixels included in the pixel group by adjusting the shape of the isolation region included in the pixel group. The disclosed technology provides the image sensing device which can adjust the shape of the isolation regions included in the pixel group according to types of the optical filters included in the pixel group.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
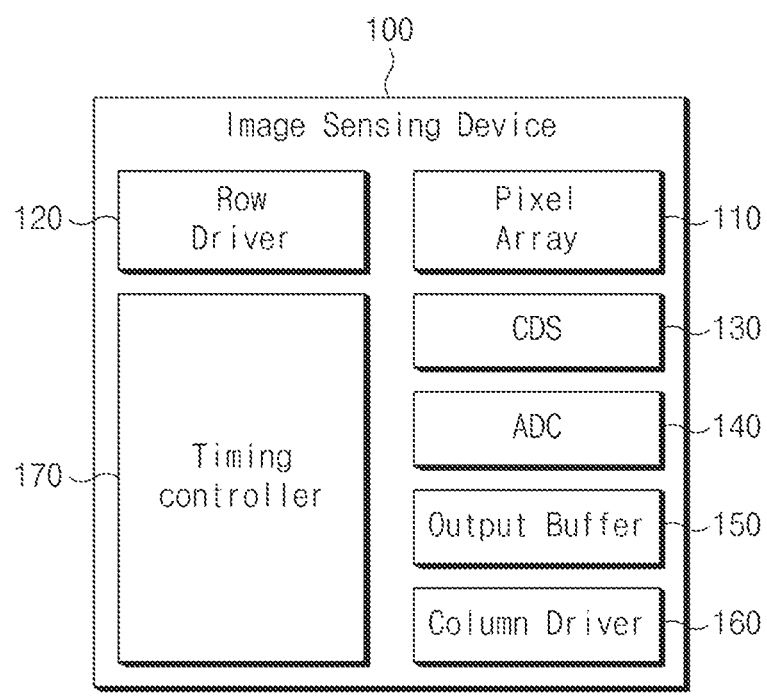
FIG. 1 is a block diagram illustrating an example of an image sensing device based on some implementations of the disclosed technology.

FIG. 1 is a block diagram illustrating an image sensing device 100 based on some implementations of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry.

The pixel group may include any number of unit pixels. For example, the unit pixels included in the pixel group may be arranged in a matrix array. The pixel array 110 may receive driving signals, including a row selection signal, a pixel reset signal and a transfer signal, from the row driver 120. Upon receiving the driving signal, corresponding imaging pixels in the pixel array 110 may be activated to perform the operations corresponding to the row selection signal, the pixel reset signal, and the transfer signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row decoder 120 may sequentially enable the pixel reset signal for resetting imaging pixels corresponding to at least one selected row, and the transfer signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., a floating diffusion region node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transfer rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
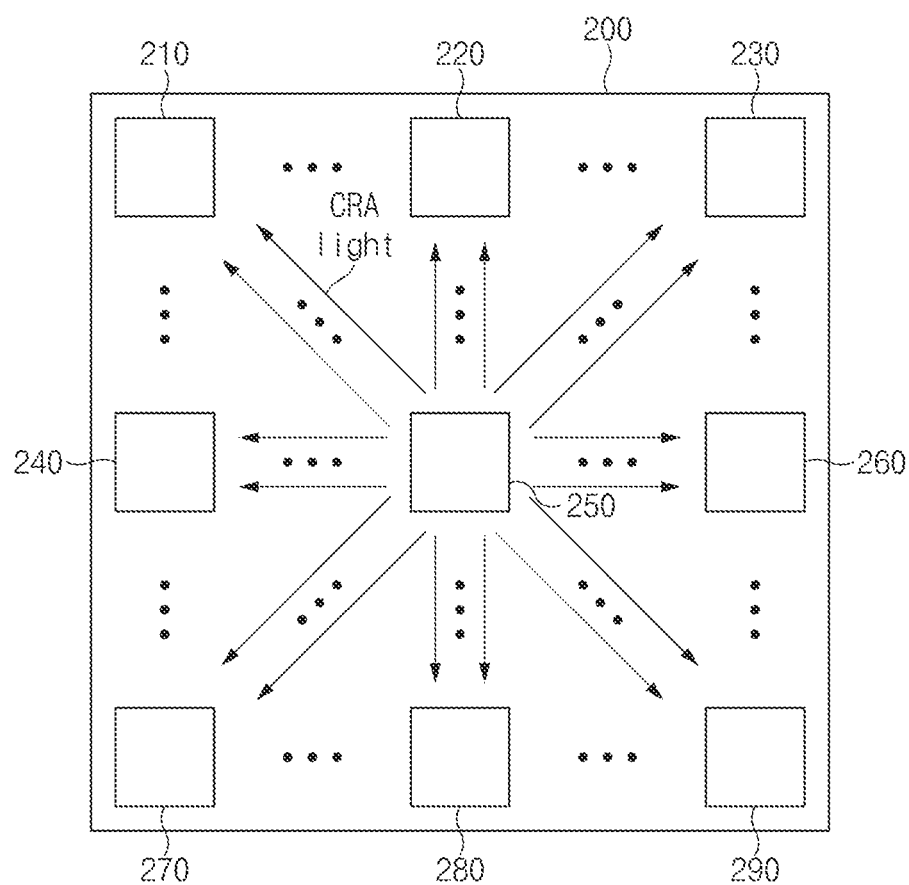
FIG. 2 is a schematic view illustrating an example of some parts of a pixel array shown in FIG. 1 based on some implementations of the disclosed technology.

FIG. 2 is a schematic view illustrating an example of some parts of the pixel array 200 shown in FIG. 1 based on some implementations of the disclosed technology.

Referring to FIG. 2, the pixel array 200 may be a region for receiving incident light, and the incident light may be refracted by a module lens (not shown). The module lens may be disposed between the pixel array 200 and an object to be captured.

The pixel array 200 may include a plurality of pixel group arrays 210 to 290 arranged in a matrix structure, and each of the pixel group arrays 210 to 290 may include at least two pixel groups.

In some implementations, one pixel group may include different unit pixels located adjacent to each other, e.g., four unit pixels located adjacent to each other. In addition, the pixel group array (e.g., 210) shown in FIG. 2 may include four pixel groups arranged in, for example, a (2×2) matrix structure.

Light beams having different chief ray angles (CRAs) may be incident upon the plurality of pixel group arrays 210 to 290. The chief ray angle (CRA) may refer to an angle between a chief ray passing through the center point of an iris and a straight line for connecting the center point of a lens to the center point of the iris.

As described above, after the incident light has been refracted by the module lens (not shown), the incident light may be incident upon the pixel array 200 after passing through a focal point of the module lens.

The incident light having passed through the focal point of the module lens may be refracted by a greater angle as the distance between the incident light and the center point of the pixel array 200 becomes longer. Therefore, one incident light incident upon the pixel group array (e.g., 210) located close to a corner or vertex of the pixel array 200 may have a greater chief ray angle (CRA) than the incident light incident upon the pixel group array (e.g., 250) disposed at the center of the pixel array 200.

In some implementations, unit pixels included in one pixel group may share one microlens and one optical filter. Each of the unit pixels may include one photoelectric conversion region corresponding to one unit pixel. Thus, one pixel group array with four pixel groups (e.g., 210) may include four microlenses for the four pixel groups, respectively, with a total of 16 photoelectric conversion regions.

In some other implementations, different unit pixels sharing one microlens and one optical filter may construct a (3×3) matrix structure or a (4×4) matrix structure, without being limited to the (2×2) matrix structure. In this case, one pixel group array may include four microlenses and 36 photoelectric conversion regions, or may include 64 photoelectric conversion regions.

The image sensing device 100 may form an image of a target object to be captured upon receiving pixel signals from the respective pixel groups included in the pixel array 200.

Four unit pixels included in one pixel group may share only one optical filter. Accordingly, the image sensing device 100 may create image information of the target object upon receiving pixel signals from the unit pixels sharing the optical filter.

The image sensing device 100 may calculate four pixel signals respectively obtained from the four unit pixels included in one pixel group, and may thus obtain a signal corresponding to the pixel group based on the calculated four pixel signals. For example, each pixel group may include sensing pixels with color filters designed to capture color images and the different sensing pixels with color filters within a pixel group may be arranged to a desired color pattern such as the Bayer color pattern based on red, green and blue colors with 25% in red, 50% in green and 25% in blue as shown in the examples in FIGS. 3 and 5.

When imbalance occurs between the pixel signals generated from the unit pixels included in the pixel group, image information of the object may be deteriorated. When the incident light incident on one pixel group is not uniformly separated with respect to the unit pixel included in the pixel group, a difference in pixel signal may be generated depending on the position of the unit pixel. When the pixel signals of the unit pixels included in the same pixel group are different from each other, a noise may occur in the calculation result of the pixel signal, and the image information about the object may be deteriorated.

In particular, for the unit pixels arranged in a diagonal direction within the pixel group, the amount of incident light that is isolated by an isolation structure according to a chief ray angle (CRA) of the incident light may become different from each other, which results in occurrence of imbalance between the pixel signals. As a result, such imbalance between the pixel signals output from the pixel groups included in the pixel group arrays (e.g., 210) located far from the center of the pixel array 200 may unavoidably increase. The CRA of incident light incident on a pixel group located far from the center of the pixel array may be greater than the CRA of incident light incident on a pixel group located closer to the center of the pixel array. Therefore, the isolation structure located in the center of the pixel group located away from the center of the pixel array separates the incident light more unevenly than the separation structure in which the pixel group located near the center of the pixel array is located in the center. Therefore, the shape or position of the separation structure can be adjusted to uniformly separate the incident light.

Some implementations of the disclosed technology configure the isolation structure of the image sensing device 100 to include a cavity region to reduce imbalance between pixel signals, thereby finely adjusting the amount of reception light. With the isolation structure including the cavity region, the image sensing device 100 can adjust the amount of reception light received by the respective photoelectric conversion regions, while the photoelectric conversion regions included in the pixel group have the same size.

In addition, the image sensing device 100 may create focus information about a target object to be captured, upon receiving pixel signals generated by the unit pixels included in the respective pixel groups.

The image sensing device 100 may perform an autofocus operation in which signals obtained from four unit pixels included in one pixel group are compared with each other, and a difference in phase between the signals is detected according to the result of comparison, resulting in implementation of the autofocus function. Accordingly, if the imbalance between signals obtained from unit pixels included in one pixel group increases, the focus detection operation may not be properly performed. The imbalance of the pixel signal may be greater in unit pixels positioned diagonally with respect to the center of the pixel array in the same pixel group.

For example, the image sensing device 100 may allow incident light applied to the pixel array 200 through the module lens (not shown) to be isolated/detected for each of the unit pixels included in the same pixel group, and may calculate a phase of the incident light based on pixel signals detected by the respective unit pixels. For example, when the pixel signals to be compared with each other are identical in magnitude, the image sensing device 100 may determine that the module lens (not shown) is in an in-focus position.

When the pixel signals to be compared with each other have different values, the image sensing device 100 may move the module lens (not shown) so that the pixel signal values become identical to each other, thereby adjusting the focus (or focal point).

Figure 3:
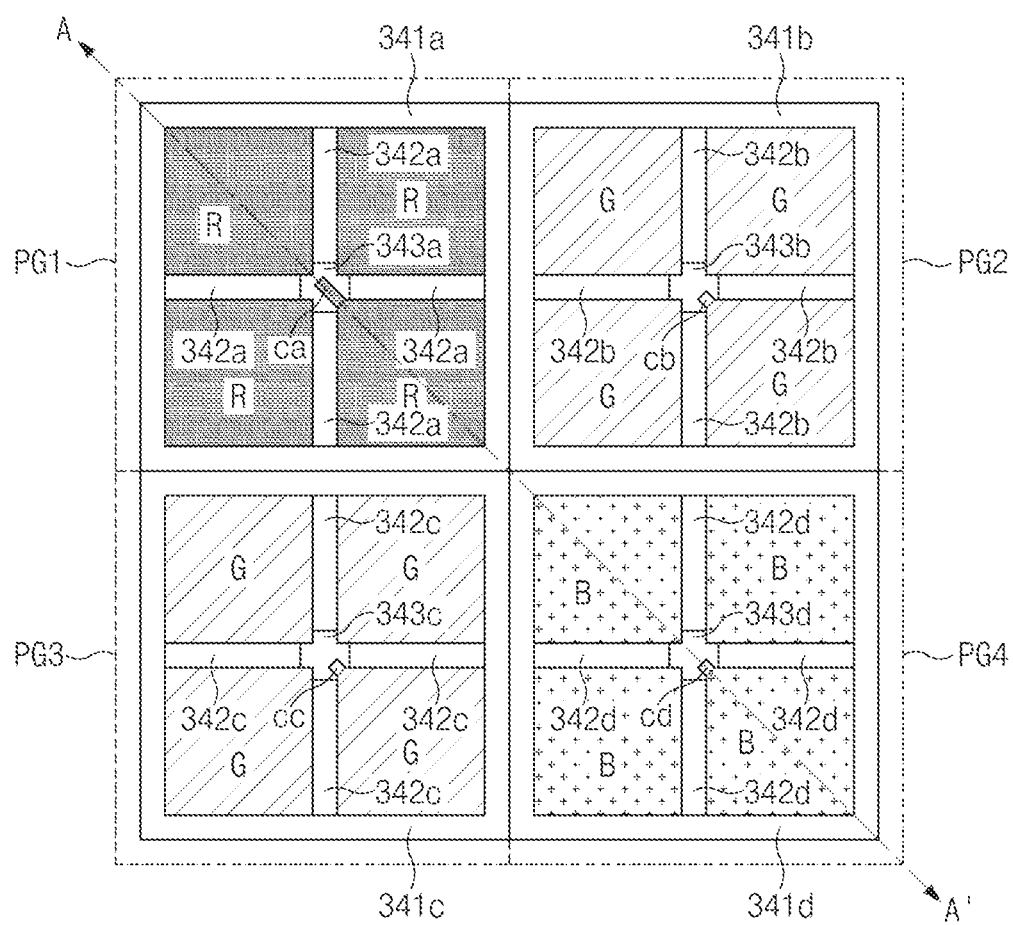
FIG. 3 is a schematic diagram illustrating a pixel group array and isolation structure arrays included in the pixel group array based on some implementations of the disclosed technology.

FIG. 3 is a schematic diagram illustrating a pixel group array 300 and isolation structures in the example of isolation structure arrays included within the pixel group array 300 based on some implementations of the disclosed technology.

Referring to FIG. 3, the pixel group array 300 may correspond to the pixel group array 210 shown in FIG. 2.

The pixel group array 300 may include, for example, four pixel groups PG1 to PG4, which include a first pixel group PG1, a second pixel group PG2, a third pixel group PG3, and a fourth pixel group PG4.

Each of the pixel groups PG1 to PG4 may include a plurality of photoelectric conversion regions for converting incident light into photocharges, a microlens for guiding the incident light to a photoelectric conversion region, an optical filter for selectively passing light having passed through the microlens according to a wavelength of the light, and a detailed description thereof will herein be omitted for convenience of description.

The isolation structures or isolation structure array in the example in FIG. 3 may include a plurality of first isolation structures 341a, 341b, 341c, and 341c, a plurality of second isolation structures 342a, 342b, 342c, and 342d, and a plurality of third isolation structures 343a, 343b, 343c, and 343d.

The first to third isolation structures 341a~341d, 342a~342d, and 343a~343d may isolate the adjacent photoelectric conversion regions from each other. In addition, the first to third isolation structures 341a~341d, 342a~342d, and 343a~343d may have different refractive indices from a substrate layer where the isolation structures are formed, and light incident upon the pixel array 200 may be isolated for each photoelectric conversion region.

The same description of the pixel groups PG1~PG4 will herein be omitted for convenience of description, and the following description will hereinafter be described centering upon the first pixel group PG1 for brevity.

The first pixel group PG1 may include a single first isolation structure 341a, four second isolation structures 342a, and a single third isolation structure 343a.

The first isolation structure 341a may be located along an external edge of the first pixel group PG1 to separate and isolate the unit pixels within the first pixel group PG1 from surroundings and adjacent pixel groups (e.g., adjacent pixel groups PG2 and PG3 and the diagonally displaced pixel group PG4). The first isolation structure 341a is disposed between the first pixel group PG1 and other pixel groups PG2 and PG3 that are in contact with the first pixel group PG1.

In some implementations, the first isolation structure 341a may electrically and physically isolate the photoelectric conversion regions included in the first pixel group PG1 from other photoelectric conversion regions included in other pixel groups PG2 and PG3 adjacent to each other.

The second isolation structures 342a may be disposed between two adjacent photoelectric conversion regions included in the first pixel group PG1. The second isolation structures 342a may electrically and physically isolate the photoelectric conversion regions included in the first pixel group PG1 from each other. For example, the second isolation structures 342*a* may be located between two adjacent photoelectric conversion regions.

In some implementations, each of the second isolation structures 342*a* may be formed to extend from the center of the first pixel group PG1 toward the first isolation structure 341*a*.

The third isolation structure 343*a* may be located at the center of the first pixel group PG1. The center of the first pixel group PG1 may refer to a region that is spaced apart by the same distance from each of the photoelectric conversion regions included in the pixel group PG1. In addition, the third isolation structure 343*a* may be disposed between the second isolation structures 342*a*.

The third isolation structure 343*a* may include a cavity region (ca). The cavity region (ca) may be included in the third isolation structure 343*a*, and may be adjacent with at least one of four photoelectric conversion regions locating adjacent the third isolation structure 343*a*. In some implementations, when the proceeding direction of incident light is parallel to the diagonal direction in FIG. 3 and thus there are two photoelectric conversion regions are located in the pixel array group to be parallel to the proceeding direction of incident light, the cavity region (ca) may be adjacent with any one of two photoelectric conversion regions located parallel to the proceeding direction of incident light. The cavity region (ca) may be formed to extend from the photoelectric conversion regions locating adjacent the cavity region (ca) toward the center point of the third isolation structure 343*a*.

Here, the first width may refer to a length of the third isolation structure 343*a* overlapping with a first diagonal line that passes through both the center of the pixel group PG1 and one vertex of the pixel group PG1. The second width may refer to a length of the third isolation structure 343*a* overlapping with a second diagonal line that passes through both the center of the pixel group PG1 and another vertex of the pixel group PG1. The cavity region (ca) may be formed so that the first width and the second width are different from each other. The cavity region (ca) may be formed such that the first width and the second width are different from each other, thereby adjusting the amount of light beams incident upon the unit pixels arranged in a diagonal direction.

By formation of the cavity region (ca), the photoelectric conversion region locating adjacent the cavity region (ca) may acquire additional amount of the reception light compared to when cavity region(ca) is not formed. In addition, as the cavity region (ca) is formed, among the unit pixels included in the first pixel group PG1, pixel signals of some unit pixels including the photoelectric conversion regions locating adjacent the cavity region (ca) and pixel signals of other pixels located in a diagonal direction to a unit pixel including the cavity region (ca) can be adjusted by controlling the amount of incident light separated by third isolation structure (343*a*). More specifically, as formed cavity region (ca), position of center of the third isolation structure (343*a*) that separates the incident light is adjusted.

In some implementations, the shapes of the cavity regions (e.g., ca, cb, cc, and cd) may vary depending on the positions of the pixel groups (e.g., PG1 to PG4) included in the pixel array 200.

For example, in the cavity region included in the pixel groups located far from the center point of the pixel array 200, the length extending from the photoelectric conversion region toward the center point of each of the third isolation structures 343*a* to 343*d* may become longer.

For example, each of the first to third isolation structures 341*a* to 343*a* may include silicon oxide. In some other implementations, each of the first to third isolation structures 341*a* to 343*a* may include metal, for example, tungsten (W).

The above description can be equally applied to the isolation structures 341*b*~343*b*, 341*c*~343*c*, and 341*d*~343*d* respectively included in the second, third, and fourth pixel groups PG2, PG3 and PG4.

Each of the pixel groups PG1, PG2, PG3, and PG4 may include optical filters R, G, and B for selectively passing incident light according to wavelengths. For example, each of the pixel groups PG1, PG2, PG3, and PG4 may include at least one of a first optical filter (R) for passing only red light, a second optical filter (G) for passing only green light, and a third optical filter (B) for passing only blue light.

A wavelength of red light may be set to 620 nm to 750 nm. A wavelength of green light may be set to 495 nm to 570 nm. In addition, a wavelength of blue light may be set to 450 nm to 495 nm.

In some implementations, the first to third optical filters R, G and B may be arranged in a Bayer pattern over the pixel array 200. The Bayer pattern may refer to a pattern in which one first optical filter (R), two second optical filters (G), and one third optical filter (B) are arranged in a (2×2) matrix, and the two second optical filters (G) are arranged in a diagonal direction.

For example, the first pixel group PG1 may include the first optical filter (R), and each of the second pixel group PG2 and third pixel group PG3 may include the second optical filter (G). In addition, the fourth pixel group PG4 may include the third optical filter (B).

As the proceeding path of incident light is changed depending on the refractive index of light having selectively passed through the optical filter, the shapes of the cavity regions (ca, cb, cc, and cd) respectively included in the third isolation structures 343*a*, 343*b*, 343*c*, and 343*d* may be changed depending on the types of optical filters respectively included in the pixel groups PG1, PG2, PG3, and PG4.

For example, as the wavelength of light becomes longer, the refractive index becomes smaller. The cavity region (ca) included in the first pixel group PG1 provided with the first optical filter (R) may be larger in size than the cavity region (cd) included in the fourth pixel group PG4 provided with the third optical filter (B).

The size of each of the cavity regions (ca, cb, cc, cd) may be changed depending on wavelengths of incident light having passed through the optical filter. The cavity region (ca) located below the first optical filter (R) may be larger in size than the other cavity region (cd) located below the third optical filter (B).

By the cavity regions (ca, cb, cc, cd) respectively included in the third isolation structures 343*a*, 343*b*, 343*c*, and 343*d*, signal imbalance between unit pixels diagonally adjacent to each other can be easily removed.

In some other implementations, the sizes of the cavity regions (ca, cb, cc, cd) may be changed depending on the position of the pixel group array 300 over the pixel array 200.

As incident light becomes closer to the center of the pixel array 200, the chief ray angle (CRA) of the incident light becomes smaller. Accordingly, a difference in pixel signal between unit pixels included in the pixel group located adjacent to the center of the pixel array 200 may be smaller than a signal difference between unit pixels included in the other pixel group located far from the center of the pixel array 200.

Therefore, as the pixel group is located closer to the center of the pixel array 200, the cavity region included in each of the third isolation structures becomes smaller in size.

In some implementations, the pixel groups (e.g., PG1, PG2, PG3, and PG4), each of which includes the photoelectric conversion regions arranged in a (2×2) matrix structure, may include a single first isolation structure, four second isolation structures, and a single third isolation structure.

In some other implementations, the pixel group may include a plurality of photoelectric conversion regions arranged in an (n×n) matrix structure (where 'n' is an integer of 3 or greater). The photoelectric conversion regions included in each pixel group may be arranged to share the optical filter and the microlens, and may be arranged in, for example, a nona (3×3) structure or a hexa (6×6) structure.

When the pixel group includes the plurality of photoelectric conversion regions arranged in the nona (3×3) structure, the first isolation structure may be disposed between different pixel groups located adjacent to each other. In addition, the second isolation structures may be disposed between two adjacent photoelectric conversion regions included in one pixel group. The third isolation structures may be disposed between the second isolation structures, and may interconnect the second isolation structures.

The photoelectric conversion regions included in the pixel group are arranged in the nona (3×3) structure, each of the pixel groups may include a single first isolation structure, 12 second isolation structures, and four third isolation structures.

Figure 4:
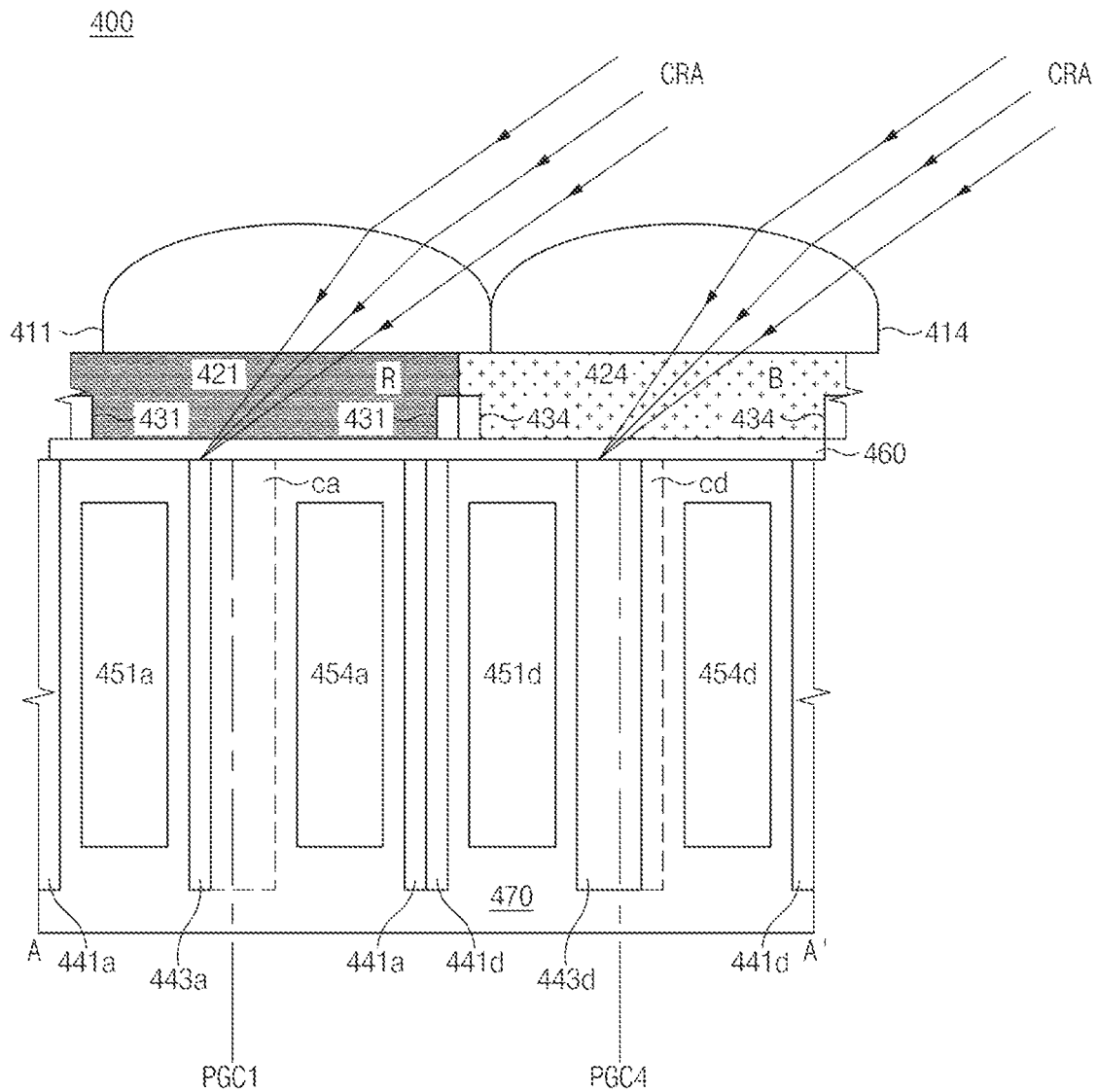
FIG. 4 is a cross-sectional view illustrating an example of a pixel group array taken along a first cutting line shown in FIG. 3 based on some implementations of the disclosed technology.

FIG. 4 is a cross-sectional view 400 illustrating an example of the pixel group array 400 taken along the first cutting line A-A' shown in FIG. 3 based on some implementations of the disclosed technology. FIG. 4 illustrates paths of the incident lights each having an exemplary CRA. The cross-sectional view 400 shown in FIG. 4 may be a cross-sectional view corresponding to the first pixel group PG1 and the fourth pixel group PG4 shown in FIG. 3.

As incident light moves closer to the center of the pixel array 200, the CRA of the incident light becomes smaller. On the other hand, as incident light moves closer to the edge or vertex of the pixel array 200, the CRA of the incident light becomes greater.

By the microlenses 411 and 414, incident light may be guided to the photoelectric conversion regions 451a, 454a, 451d, and 454d. The microlenses 411 and 414 may be shifted toward the center of the pixel array 200 in response to a CRA of the incident light.

Each of the optical filters 421 and 424 may selectively pass or transmit incident light according to wavelengths. In some implementations, the optical filter 421 may refer to the first optical filter (R) for passing or transmitting red light, and the optical filter 424 may refer to the third optical filter (B) for passing or transmitting blue light.

The optical filter 421 may be formed to overlap the grid structure 431, and the optical filter 424 may be formed to overlap the grid structure 434. Each of the grid structures 431 and 434 may isolate incident light for each pixel group (e.g., PG1 or PG4). In some implementations, each of the grid structures 431 and 434 may include metal such as tungsten (W) or may include an air layer.

The optical filters 421 and 424 may be shifted toward the center of the pixel array 200 in response to the shifted degree of the microlenses 411 and 414.

A planarization layer 460 may be formed below the optical filters 421 and 424. As the planarization layer 460 is formed, physical stability of the pixel array 200 may increase.

A substrate layer 470, that is formed to include the isolation structures 441a, 443a, 441d, and 443d and the photoelectric conversion regions 451a, 454a, 451d, and 454d, may be disposed below the planarization layer 460. The substrate layer 470 may include a semiconductor substrate layer or an epitaxial layer.

In addition, the third isolation structure 443a may include the cavity region (ca), and the third isolation structure 443d may include the cavity region (cd). By adjusting the width of each of the cavity regions (ca, cd), the isolation ratio of incident lights that are respectively incident upon two adjacent photoelectric conversion regions (e.g., 451a and 454a or 451d and 454d) that are disposed to face each other based on the third isolation structure 443a or 443d can be adjusted. By adjusting the width of each of the cavity regions (ca, cd), the center of the third isolation structure(443a, 443d) where the incident light converge can be adjusted.

In some implementations, in a situation where the cavity region (ca) is formed, the amount of incident light incident upon the photoelectric conversion region (e.g., 454a) locating adjacent the formed cavity region (ca) may be greater than the amount of incident light generated in a situation where the cavity region (ca) is not formed.

In a situation where the amount of light incident upon the pixel group is constant irrespective of the presence or absence of the cavity region (ca), if the cavity region (ca) is formed, the amount of light incident upon the photoelectric conversion region 451a arranged to face the photoelectric conversion region 454a locating adjacent the cavity region (ca) may be smaller as compared to the case when the cavity region (ca) is not formed.

In addition, the direction in which each of the cavity regions (ca, cd) is formed may be determined according to CRA of incident light. For example, each of the cavity regions (ca, cd) may be located in a direction along which incident light is incident. For example, since the CRA of the incident light is along a diagonal direction, the cavity region (ca, cd) are formed along the diagonal direction as shown in FIG. 3.

In a situation where the center point of the third isolation structure 443a is identical to the center point PGC1 of the pixel group and does not include the cavity region (ca), and the center point of the third isolation structure 443d is identical to the center point PGC4 of the pixel group and does not include the cavity region (cd), the amount of light received by the photoelectric conversion region 451a or 451d adjacent to a specific point where incident light converges may be greater than the amount of light received by the other photoelectric conversion region 454a or 454d.

In a situation where the third isolation structure (e.g., 443a) includes the cavity region (ca), the center of the third isolation structure 443a is located apart from the center PGC1 of the pixel group. In this case, i.e., where the third isolation structure includes the cavity region, as shown in FIG. 4, the center of the third isolation structure 443a lies on where the incident light converges in the first pixel group PG1. Similarly, where the third isolation structure (e.g., 443d) includes the cavity region (cd), the center of the third isolation structure 443d does not lie on the center PGC4 of the pixel group but lies on where the incident light converges in the fourth pixel group PG4. In a situation where incident light converges is identical to the center of the third isolation structure 443a, the incident light can be uniformly isolated and applied to the photoelectric conversion regions (e.g., 451a and 454a) adjacent to each other. By formation of the cavity region (ca or cd), the amount of light received by each of the photoelectric conversion regions 451a and 454a that are arranged in a diagonal direction based on the third isolation structure 443a interposed therebetween can be finely adjusted.

In some implementations, the width of each of the cavity regions (ca, cd) may be determined depending on the proceeding path of the incident light. For example, the path of incident light passing through both the microlens 411 and the optical filter 421 and the path of incident light passing through both the microlens 414 and the optical filter 424 may be changed according to a difference between refractive indexes of light wavelengths.

Incident light having passed through the first optical filter 421 configured to pass red light may be less refracted than the other incident light having passed through the third optical filter 424 configured to pass blue light.

Accordingly, the distance between the point where the incident light having passed through the first optical filter 421 converges and the center point PGC1 of the first pixel group may be longer than the distance between the point where the incident light having passed through the third optical filter 424 converges and the center point PGC4 of the fourth pixel group.

The width of the cavity region (ca) included in the third isolation structure 443a located below the first optical filter 421 may be formed to be larger than the width of the cavity region (cd) included in the third isolation structure 443d located below the third optical filter 424, so that a difference between refractive indexes of light wavelengths can be corrected.

As described above, the widths of the cavity regions (ca, cd) are adjusted so that the amount of light incident upon the photoelectric conversion regions 451a, 454a, 451d, and 454d can be adjusted, and imbalance between pixel signals output from two unit pixels that are diagonally adjacent to each other based on the third isolation structures 443a or 443d interposed therebetween can be eliminated.

Figure 5:
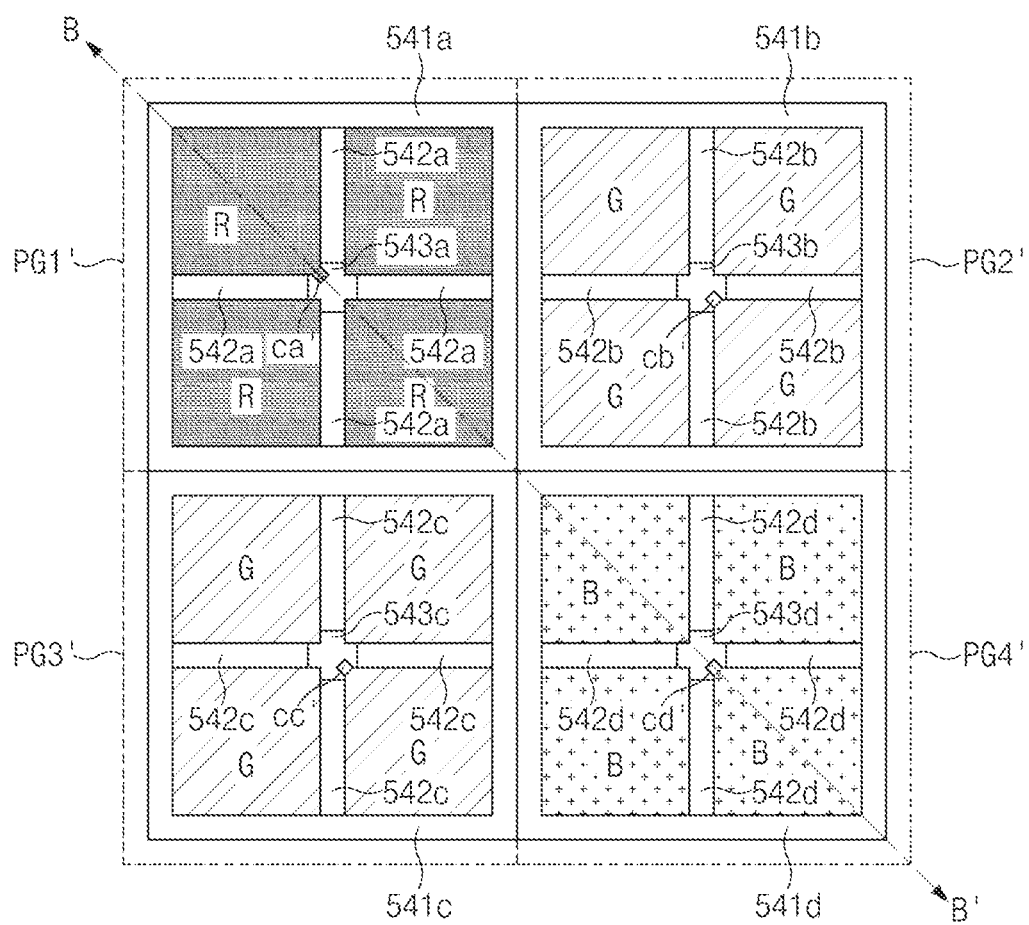
FIG. 5 is a schematic diagram illustrating a pixel group array and isolation structure arrays included in the pixel group array based on some implementations of the disclosed technology.

FIG. 5 is a schematic diagram illustrating a pixel group array 500 and isolation structure arrays included in the pixel group array based on other implementations of the disclosed technology.

Referring to FIG. 5, the pixel group array 500 may include, for example, four pixel groups PG1', PG2', PG3', and PG4'. For convenience of description, the four pixel groups may include a first pixel group PG1', a second pixel group PG2', a third pixel group PG3', and a fourth pixel group PG4'.

The remaining parts of the isolation structure array included in the pixel group array 500 shown in FIG. 5 other than the third isolation structures 543a, 543b, 543c, and 543d may have substantially the same shape as the isolation structure array included in the pixel group array 300 shown in FIG. 3, as such redundant description thereof will herein be omitted for brevity, and the following description will hereinafter be described centering upon the third isolation structures 543a, 543b, 543c, and 543d.

In some other implementations, the third isolation structure 543a may include a cavity region (ca'), the second isolation structure 543b may include a cavity region (cb'), the third isolation structure 543c may include a cavity region (cc'), and the fourth isolation structure 543d may include a cavity region (cd').

In some implementations, each of the cavity regions (ca', cb', cc', cd') may be disposed to locate adjacent at least one of two photoelectric conversion regions that are diagonally arranged among the plurality of unit pixels included in each of the pixel groups PG1' to PG4'. The diagonal direction in which the two unit pixels are arranged may be parallel to the proceeding direction of incident light.

For example, the third isolation structure 543a included in the first unit pixel PG1' may include the cavity region (ca'). The cavity region (ca') may be formed to locate adjacent the left upper photoelectric conversion region among the photoelectric conversion regions arranged in the diagonal direction.

In addition, the third isolation structure 543d included in the fourth unit pixel PG4' may include the cavity region (cd'). The cavity region (cd') may be formed to locate adjacent the right lower photoelectric conversion region among the photoelectric conversion regions arranged in the diagonal direction.

Each of the photoelectric conversion regions locating adjacent the cavity regions (ca', cb', cc', cd') may acquire the additional amount of reception light. As a result, the amount of light received by the adjacent photoelectric conversion regions can be adjusted according to the positions of the cavity regions (ca', cb', cc', cd') and the shapes of the cavity regions (ca', cb', cc', cd').

In some implementations, the position of the cavity region (e.g., ca') formed in the pixel group (e.g., PG1') may be determined based on the pixel signals output from the unit pixels included in the pixel group PG1'.

Among the unit pixels included in the pixel group PG1', there occurs the largest difference between pixel signals output from the unit pixels located parallel to the proceeding direction of incident light. Therefore, the cavity region (ca') may be formed to locate adjacent any one of unit pixels located parallel to the proceeding direction of incident light within the pixel group PG1'.

In some other implementations, the pixel signal output from the unit pixel may be affected by another unit pixel adjacent to the unit pixel.

For example, the unit pixels (e.g., unit pixels included in the pixel group PG1') including the first optical filter configured to pass or transmit red light may receive incident light from the unit pixels (e.g., unit pixels included in the pixel group PG2' or PG3'). This is due to a difference in refractive indices between the first optical filter and the second optical filter. As a result, imbalance between pixel signals may occur in response to an arrangement shape of the first and second optical filters disposed over the pixel array 200.

In some implementations, as the cavity region (ca') formed in the third isolation structure 543a is adjusted, imbalance between the pixel signals affected by the arrangement of the optical filters can be eliminated.

Figure 6:
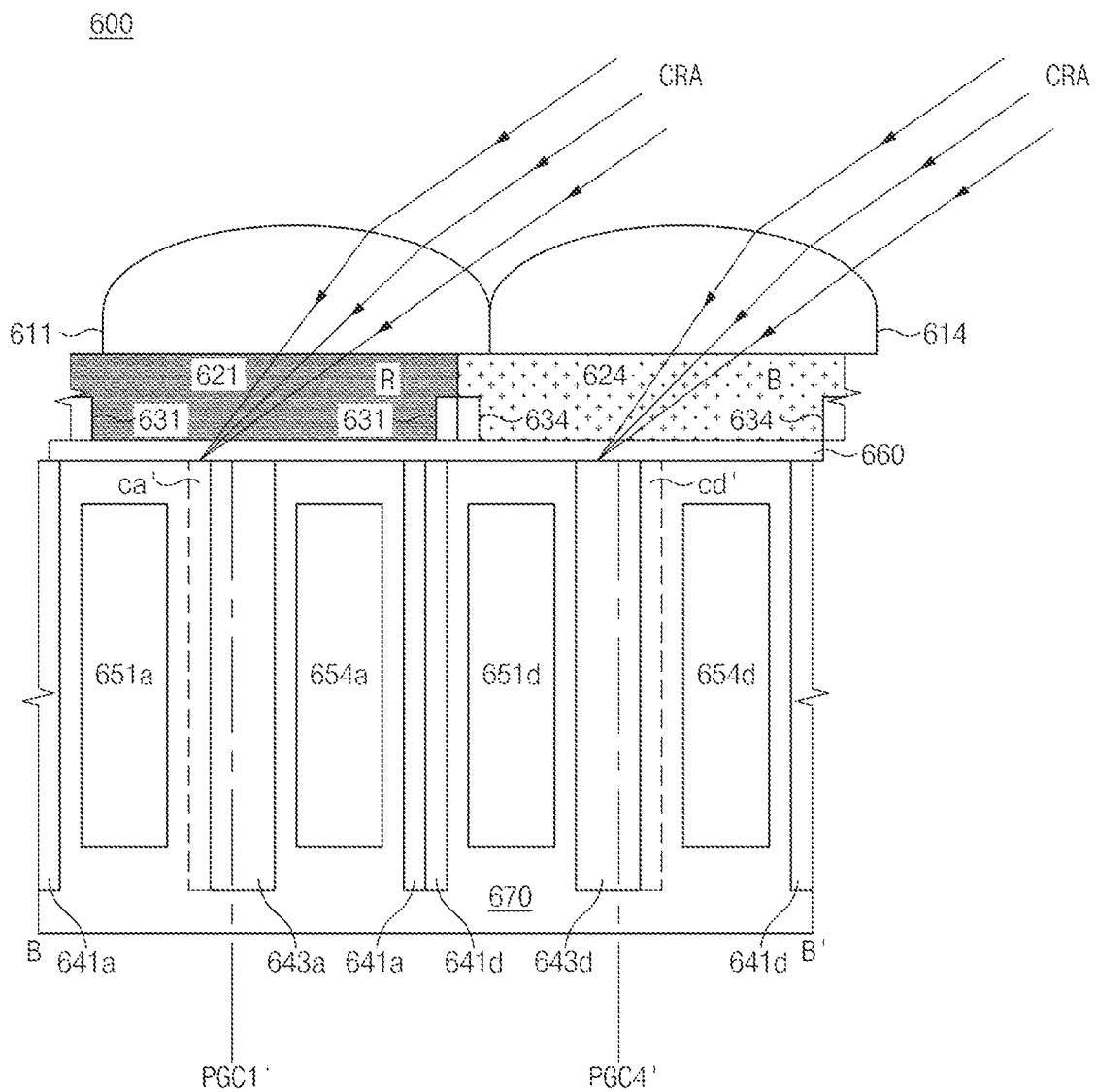
FIG. 6 is a cross-sectional view illustrating an example of a pixel group array taken along a second cutting line shown in FIG. 5 based on some implementations of the disclosed technology.

FIG. 6 is a cross-sectional view 600 illustrating an example of the pixel group array taken along the second cutting line B-B' shown in FIG. 5 based on some implementations of the disclosed technology. FIG. 6 illustrates paths of the incident lights each having an exemplary CRA. The cross-sectional view 600 shown in FIG. 6 may be a cross-sectional view corresponding to the first pixel group PG1' and the fourth pixel group PG4' shown in FIG. 5.

The microlenses 611 and 614, the optical filters 621 and 624, the planarization layer 660, the photoelectric conversion regions 651a, 654a, 651d, and 654d, and the first isolation structures 641a and 641d shown in FIG. 6 may be substantially the same as those of FIG. 4, and as such redundant description thereof will herein be omitted for convenience of description. The following description will hereinafter center upon the third isolation structures 643a and 643d and the cavity regions ca' and cd' respectively included in the third isolation structures 643a and 643d, for convenience of description.

The cavity region (ca') included in the third isolation structure 643a disposed below the first optical filter 621 may be formed at a position opposite to the cavity region (cd') included in the third isolation structure 643d disposed below the third optical filter 624. For example, the cavity region (ca') of the third isolation structure 643a is located to be adjacent with the photoelectric conversion region 651a that is further away from the center of the pixel group array 500 and the cavity region (cd') of the third isolation structure 643d is located to be adjacent with the photoelectric conversion region 654d that is further away from the center of the pixel group array 500. Thus, the cavity region (ca') of the third isolation structure 643a is located to face the photoelectric conversion region 651a and the cavity region (cd') of the third isolation structure 643d is located to face the photoelectric conversion region 654d. The pixel group PG1' including the first optical filter 621 may receive additional refracted incident light from the pixel group (and unit pixels included in the pixel group) including the second optical filter adjacent to the first optical filter 621.

In some implementations, the unit pixels included in the pixel group PG1' may receive incident light from other unit pixels included in the other pixel group adjacent to the pixel group PG1'. In this case, the amount of incident light received by the unit pixels of the pixel group PG1' may be changed according to the positions of the unit pixels. In order to correct imbalance between pixel signals affected by the refracted incident light, the cavity region (ca') included in the third isolation structure 643a disposed below the first optical filter 621 may be arranged opposite to the cavity region (cd') included in the third isolation structure 643d disposed below the third optical filter 624.

As is apparent from the above description, the image sensing device based on some implementations of the disclosed technology can improve imbalance between pixel signals output from the respective unit pixels included in the pixel group by adjusting the shape of the isolation regions included in the pixel group.

In addition, the image sensing device based on some implementations of the disclosed technology can adjust the shape of the isolation regions included in the pixel group according to types of the optical filters included in the pixel group.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in a subsequent amendment after the application is filed or in a later filed continuing application.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device comprising:
    a pixel array configured to include a plurality of pixel groups arranged in rows and columns and to detect incident light,
    wherein each of the pixel groups includes:
        an optical filter configured to selectively transmit the incident light;
        a plurality of photoelectric conversion regions disposed below the optical filter to convert the incident light into electrical signals, respectively;
        a first isolation structure disposed along an edge of each corresponding pixel group;
        a plurality of second isolation structures disposed between two adjacent photoelectric conversion regions of each corresponding pixel group; and
        a third isolation structure disposed between the second isolation structures and configured to interconnect the second isolation structures,
    wherein the third isolation structure includes a cavity region formed adjacent to one of the photoelectric conversion regions of each corresponding pixel group, and
    wherein the cavity region has a size that is determined based on wavelengths of light passing through the optical filter.

2. The image sensing device according to claim 1, wherein:
    each of the pixel groups further includes a microlens by which the incident light converges; and
    the cavity region is disposed to be adjacent to a photoelectric conversion region located in a direction along which the incident light is incident upon the microlens.

3. The image sensing device according to claim 1, wherein:
    each of the pixel groups further includes a microlens by which the incident light converges; and
    the cavity region is disposed to be adjacent to a photoelectric conversion region located in a direction along which the incident light is emitted from the microlens.

4. The image sensing device according to claim 1, wherein an optical filter of a first pixel group includes at least one of:
    a first optical filter configured to pass red light;
    a second optical filter configured to pass green light; and
    a third optical filter configured to pass blue light.

5. The image sensing device according to claim 1, wherein:
    the cavity region has a size according to positions of the pixel group disposed over the pixel array.

6. The image sensing device according to claim 5, wherein the size of the cavity region is smaller as the corresponding pixel group is located closer to a center point of the pixel array.

7. The image sensing device according to claim 1, wherein:
    each of the second isolation structures is disposed at a center of the two adjacent photoelectric conversion regions of the corresponding pixel group.

8. The image sensing device according to claim 1, wherein:
    the third isolation structure is disposed at a center of the pixel group.

9. The image sensing device according to claim 1, wherein:
    a first length corresponding to a length of the third isolation structure overlapping with a first diagonal line that passes through both a center of the pixel group and one vertex of the pixel group is different from a second length corresponding to a length of the third isolation structure overlapping with a second diagonal line that passes through both a center of the pixel group and another vertex of the pixel group.

10. The image sensing device according to claim 1, wherein:
the photoelectric conversion regions included in each of the pixel groups are arranged in a (2×2) matrix structure having two rows and two columns.

11. The image sensing device according to claim 1, wherein:
the photoelectric conversion regions included in each of the pixel groups are arranged in a (3×3) matrix structure having three rows and three columns.

12. An image sensing device comprising:
a pixel array configured to include a plurality of pixel groups arranged in rows and columns and to detect incident light,
wherein each of the pixel groups includes:
an optical filter configured to selectively transmit the incident light;
a plurality of photoelectric conversion regions disposed below the optical filter to convert the incident light into electrical signals, respectively;
a first isolation structure disposed along an edge of each corresponding pixel group;
a plurality of second isolation structures disposed between two adjacent photoelectric conversion regions of each corresponding pixel group; and
a third isolation structure disposed between the second isolation structures and configured to interconnect the second isolation structures,
wherein the third isolation structure includes a cavity region formed adjacent to one of the photoelectric conversion regions of each corresponding pixel group, and
wherein an optical filter of a first pixel group includes at least one of:
a first optical filter configured to pass red light;
a second optical filter configured to pass green light; and
a third optical filter configured to pass blue light, and wherein:
the cavity region disposed below the first optical filter has a larger size than that of another cavity region disposed below the third optical filter.

13. An image sensing device comprising:
a pixel array configured to include a plurality of pixel groups,
wherein the pixel groups includes a first pixel group that includes:
an optical filter configured to selectively pass incident light having a predetermined wavelength band;
a plurality of photoelectric conversion regions disposed below the optical filter and arranged in rows and columns;
a first isolation structure configured to isolate the plurality of the photoelectric conversion regions from other pixel groups;
a plurality of second isolation structures disposed between two of the plurality of the photoelectric conversion regions; and
a third isolation structure interconnecting the second isolation structures,
wherein any one of the plurality of the photoelectric conversion regions is adjacent to a cavity region extending from a center of the third isolation structure in a diagonal direction of the pixel array, and
wherein the cavity region has a size that is changed based on wavelengths of light passing through the optical filter.

14. The image sensing device according to claim 13, wherein the first pixel group further includes a microlens, and
wherein the cavity region extends parallel to a proceeding direction of the incident light.

15. The image sensing device according to claim 13, wherein:
each of the plurality of the photoelectric conversion regions has a same size.

16. The image sensing device according to claim 13, wherein the cavity region has a size depending on a location of the first pixel group such that the size becomes larger as the first pixel group is located farther from the center of the pixel array.

17. The image sensing device according to claim 13, wherein:
the plurality of the photoelectric conversion regions are arranged in a (2×2) matrix structure having two rows and two columns.

18. The image sensing device according to claim 13, wherein:
the plurality of the photoelectric conversion regions are arranged in a (3×3) matrix structure having three rows and three columns.

* * * * *